United States Patent
Nakagawa

(10) Patent No.: US 8,698,967 B2
(45) Date of Patent: Apr. 15, 2014

(54) ELECTRO-OPTIC DEVICE, ELECTRONIC DEVICE, AND METHOD OF MANUFACTURING ELECTRO-OPTIC DEVICE

(75) Inventor: Masashi Nakagawa, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 43 days.

(21) Appl. No.: 13/430,971

(22) Filed: Mar. 27, 2012

(65) Prior Publication Data

US 2012/0249906 A1 Oct. 4, 2012

(30) Foreign Application Priority Data

Apr. 1, 2011 (JP) ................. 2011-081650

(51) Int. Cl.
*G02F 1/1343* (2006.01)

(52) U.S. Cl.
USPC ............................................. 349/38; 349/39

(58) Field of Classification Search
None
See application file for complete search history.

(56) References Cited

U.S. PATENT DOCUMENTS

| | | | |
|---|---|---|---|
| 6,618,033 B2 | 9/2003 | Takafuji | |
| 6,828,584 B2 | 12/2004 | Arao et al. | |
| 7,078,277 B2 | 7/2006 | Arao et al. | |
| 7,253,038 B2 | 8/2007 | Arao et al. | |
| 2009/0153760 A1* | 6/2009 | Murade | 349/39 |
| 2010/0188591 A1* | 7/2010 | Oikawa | 349/39 |

FOREIGN PATENT DOCUMENTS

| | | | |
|---|---|---|---|
| JP | 7-128685 A | 5/1995 | |
| JP | 9-258268 A | 10/1997 | |
| JP | 11-311810 A | 11/1999 | |
| JP | 2003-37271 A | 2/2003 | |
| JP | 2004-94198 A | 3/2004 | |
| JP | 2005-309450 A | 11/2005 | |
| JP | 2006-208538 A | 8/2006 | |

* cited by examiner

Primary Examiner — Thanh-Nhan P Nguyen
(74) Attorney, Agent, or Firm — ALG Intellectual Property, LLC

(57) ABSTRACT

A liquid crystal device as the electro-optic device according to the application example includes a transistor, a pixel electrode which is provided corresponding to the transistor, and a capacitive wiring of which a part is provided so as to face the pixel electrode between an element substrate and the pixel electrode, and configures a retention capacitor through the pixel electrode and a dielectric layer in which the capacitive wiring is formed so as to be embedded in an insulating film which is provided between the element substrate and the pixel electrode, the surface thereof on the pixel electrode side is planarized along with an insulating film.

5 Claims, 9 Drawing Sheets

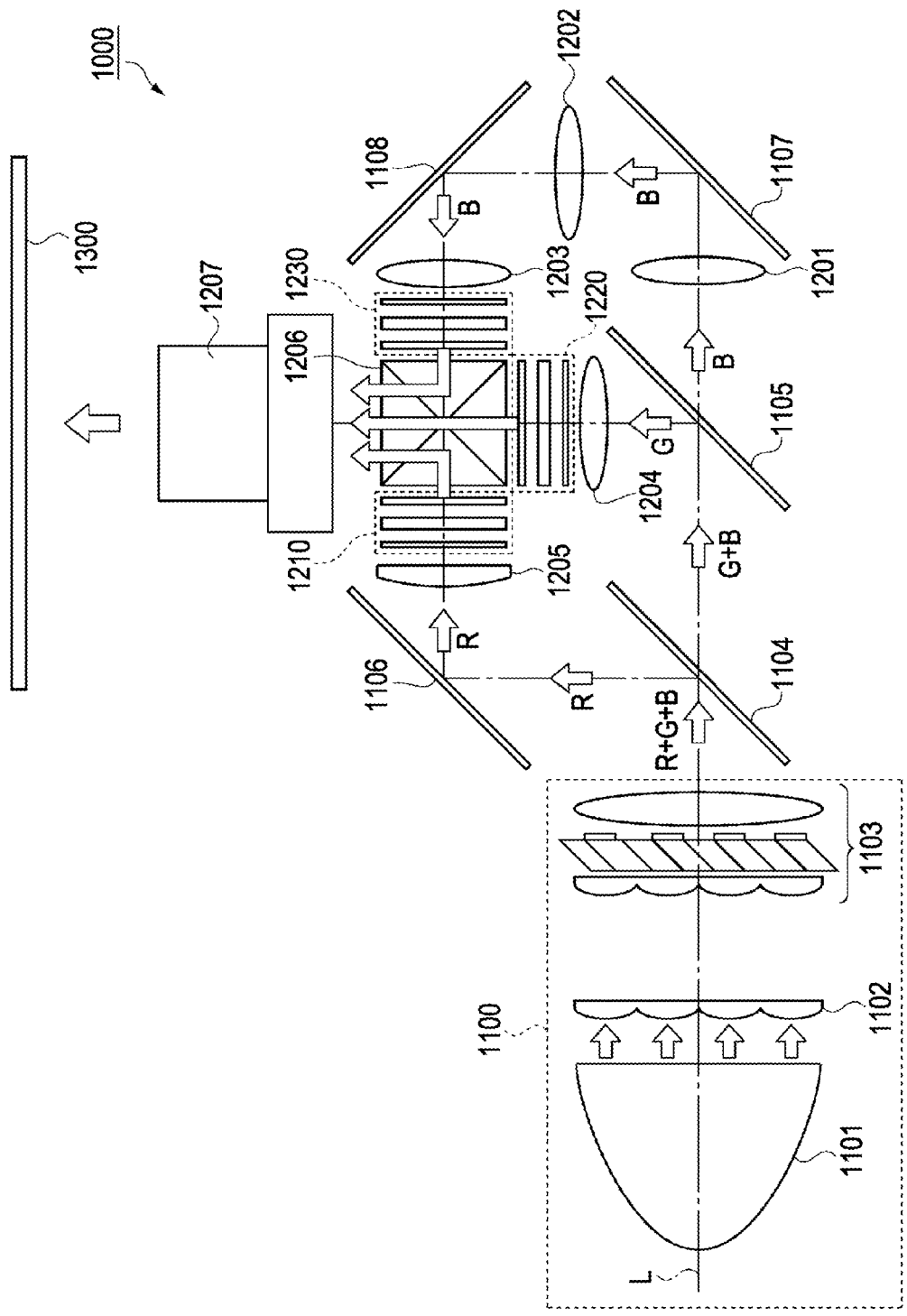

ELECTRO-OPTIC DEVICE, ELECTRONIC DEVICE, AND METHOD OF MANUFACTURING ELECTRO-OPTIC DEVICE

BACKGROUND

1. Technical Field

The present invention relates to an electro-optic device, an electronic device, and a manufacturing method of electro-optic device.

2. Related Art

As the above described electro-optic device, for example, there is an active matrix liquid crystal display in which a thin film transistor (TFT) is used as a switching element for pixels.

In this liquid crystal display, a pixel circuit which includes a thin film transistor, and a variety of wirings, electric capacitors, or the like, which are connected to the thin film transistor, or a peripheral circuit thereof is formed on a substrate.

As a configuration of the above pixel circuit, a liquid crystal display is disclosed in JP-A-7-128685, in which a light shielding black matrix is arranged between a pixel electrode and a source line layer through an interlayer insulating film on an active matrix substrate, shields the source line by applying a specific potential, and forms a storage capacitor with the pixel electrode.

According to the liquid crystal display, it is possible to reduce crosstalk due to the potential of the source line, to have a large pixel retention capacitor, and to realize a high aperture ratio, by shielding the source line using the black matrix.

However, in the liquid crystal display in JP-A-7-128685, a step occurs at a portion which is overlapped with the black matrix in the pixel electrode, that is, a portion where the pixel retention capacitor is configured, and there is a problem in that an uneven display may occur by a disorder of an orientation of the liquid crystal molecules in the step portion.

SUMMARY

Application Example 1

An electro-optic device according to the application example includes, a substrate; a transistor; a pixel electrode which is provided to correspond to the transistor; and a capacitive wiring of which a part is provided so as to face the pixel electrode between the substrate and the pixel electrode, and configures a retention capacitor through the pixel electrode and a dielectric layer, in which the capacitive wiring is embedded in an insulating film which is provided between the substrate and the pixel electrode, and of which a surface on the pixel electrode side is planarized along with the insulating film.

According to this configuration, the retention capacitor is configured at a portion where the capacitive wiring and the pixel electrode are overlapped with each other through the dielectric layer. In addition, since in the portion where the dielectric layer is provided are, the surfaces of the capacitive wiring and the insulating film are planarized, unevenness does not occur on the surface of the pixel electrode which is provided through the dielectric layer. That is, it is possible to provide an electro-optic device in which the retention capacitor is configured using the pixel electrode while securing an aperture ratio of pixels, the display unevenness is reduced compared to the related art, and an excellent display quality is secured.

Application Example 2

In the electro-optic device according to the application example, the capacitive wiring may include a first conductive film, and a second conductive film which protects the first conductive film by covering the first conductive film, and the surface of the second conductive film and the surface of the insulating film be on the same plane as each other. According to this, since the first conductive film is protected by the second conductive film, it is possible to configure the retention capacitor with no electrical defects, since the first conductive film is not damaged in the planarizing process of the surface of the capacitive wiring and the surface of the insulating film, and at least a conductivity of the first conductive film is secured.

Application Example 3

In the electro-optic device according to the application example, the pixel electrode may be arranged by crossing the two capacitive wirings which are adjacent and parallel to each other.

Due to this, it is possible to make the electric capacity large in the retention capacitor compared to a case where the pixel electrode is overlapped with one capacitive wiring. In other words, it is possible to easily secure a desired electric capacity.

Application Example 4

An electronic device according to the application example may include the electro-optic device in the application example.

In this manner, it is possible to provide an electronic device in which display unevenness is reduced compared to the related art, and an excellent display quality is secured.

Application Example 5

A method of manufacturing an electro-optic device includes, forming a capacitive wiring layer on a substrate; forming an insulating film by covering the capacitive wiring layer; exposing the capacitive wiring layer from the insulating film by polishing the insulating film, and planarizing the surfaces of the exposed capacitive wiring layer and the insulating film; forming a dielectric layer which covers the exposed capacitive wiring layer and the insulating film; and forming a pixel electrode so that a part of the pixel electrode is overlapped with the capacitive wiring layer through the dielectric layer.

According to the method, the pixel electrode is formed so that a part thereof is overlapped planarly with the capacitive wiring layer, on the dielectric layer which covers the capacitive wiring layer and the insulating film of which surfaces are planarized. Accordingly, unevenness does not occur on the surface of the formed pixel electrode. That is, it is possible to manufacture an electro-optic device in which the retention capacitor is formed using the pixel electrode while maintaining the aperture ratio of pixels, the display unevenness is reduced compared to the related art, and an excellent display quality is secured.

Application Example 6

In a manufacturing method of an electro-optic device according to the application example, the forming of the capacitive wiring layer may include, forming a first conductive film; forming a second conductive film which covers and protects the first conductive film; and forming the capacitive wiring layer by patterning the first conductive film and the second conductive film.

According to the method, since the first conductive film is protected by the second conductive film, it is possible to prevent the first conductive film from being damaged in the process of planarizing the insulating film by polishing thereof. That is, it is possible to form the retention capacitor with no electrical defects by securing at least a conductivity of the first conductive film.

Application Example 7

Another manufacturing method of the electro-optic device according to the application example includes, forming an insulating film on a substrate; forming a groove in the insulating film; filling the groove, and forming a capacitive wiring layer by covering the insulating film; exposing the capacitive wiring layer from the insulating film by polishing the capacitive wiring layer, in the groove, and planarizing surfaces of the exposed capacitive wiring layer and the insulating film; forming a dielectric layer which covers the exposed capacitive wiring layer and the insulating film; and forming a pixel electrode so that a part of the pixel electrode is overlapped with the capacitive wiring layer through the dielectric layer.

According to the method, the capacitive wiring layer is formed in the groove which is formed in advance in the insulating film. Accordingly, it is possible to separate the capacitive wiring layer and the insulating film from each other, and to expose each of them earlier compared to a case where the insulating film is polished. In addition, since the groove is embedded by the capacitive wiring layer, it is possible to prevent the capacitive wiring layer from being excessively polished in order to planarize the surfaces of the capacitive wiring layer and the insulating film.

Application Example 8

In the manufacturing method of an electro-optic device according to the application example, forming the capacitive wiring layer may include, forming a first conductive film; and forming a second conductive film which protects the first conductive film by covering the first conductive film.

According to the method, since the first conductive film is protected by the second conductive film, it is possible to prevent the first conductive film from being damaged when polishing the capacitive wiring layer. That is, it is possible to form a retention capacitor with no electrical defects by securing the conductivity of at least the first conductive film.

BRIEF DESCRIPTION OF THE DRAWINGS

The invention will be described with reference to the accompanying drawings, wherein like numbers reference like elements.

FIG. 8 is a schematic diagram which shows a configuration of a projection-type display device as an electronic device.

DESCRIPTION OF EXEMPLARY EMBODIMENTS

Hereinafter, embodiments in which the invention is embodied will be described according to drawings. In addition, drawings to be used are displayed by being appropriately enlarged or reduced in size so that portions to be described become a recognizable state.

In addition, in the embodiments to be described later, for example, when it is described as "on a substrate", it may be a case of being arranged so as to come into contact with the upper part of the substrate, a case of being arranged on the substrate through other constructs, or may be a case where a part is arranged so as to come into contact with the upper part of the substrate, and a part is arranged through other constructs.

First Embodiment

According to the embodiment, an active matrix liquid crystal device as an electro-optic device which includes a thin film transistor (TFT) as a switching element of the pixel will be described as an example. The liquid crystal device is able to be preferably used, for example, as an optical modulator (liquid crystal light valve) of a projection-type display device (liquid crystal projector) to be described later.

Liquid Crystal Device

Figure 1A:
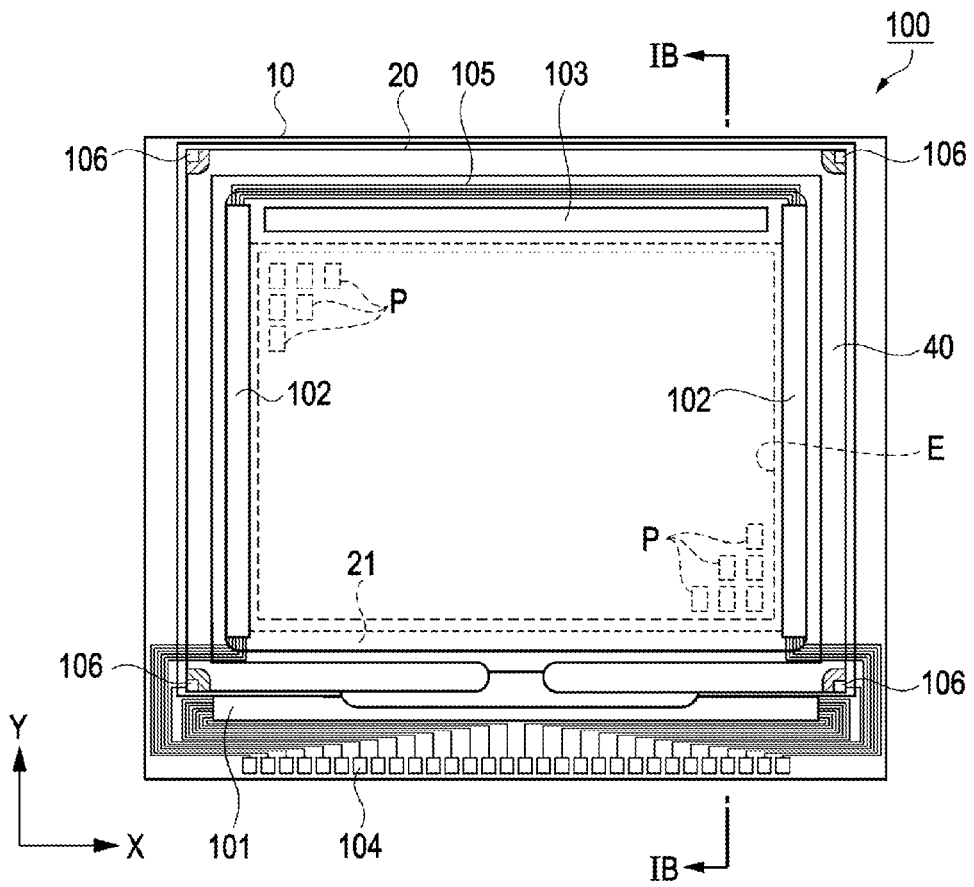
FIG. 1A is a schematic plan view of a liquid crystal device.

First, a liquid crystal device as an electro-optic device according to the embodiment will be described with reference to FIGS. 1A, 1B, and 2. FIG. 1A is a schematic plan view which shows a configuration of the liquid crystal device, FIG. 1B is a schematic cross-sectional view which is taken along line IB-IB in FIG. 1A, and FIG. 2 is an equivalent circuit diagram which shows an electrical configuration of the liquid crystal device.

Figure 1B:
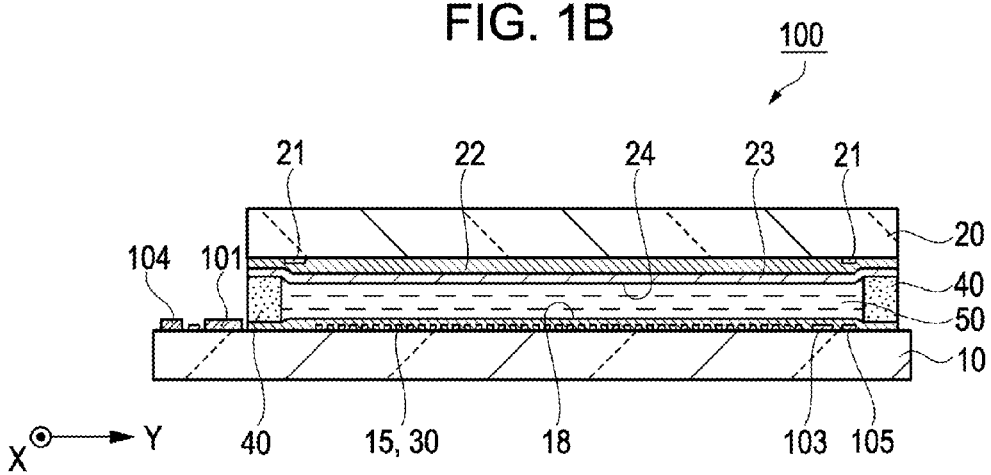
FIG. 1B is a schematic cross-sectional view of the liquid crystal device taken along line IB-IB in FIG. 1A.
Figure 2:
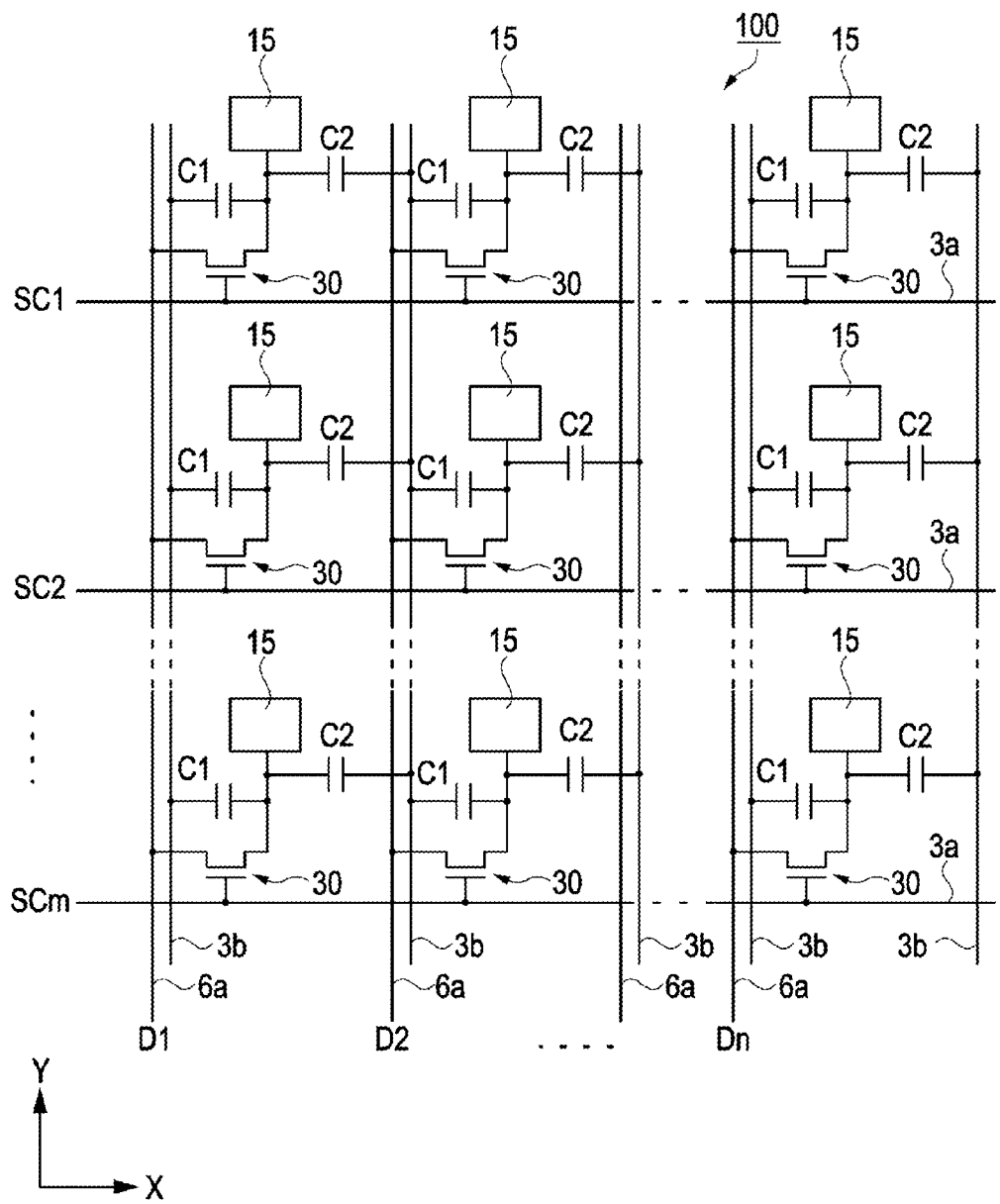
FIG. 2 is an equivalent circuit diagram which shows an electrical configuration of the liquid crystal device.

As shown in FIGS. 1A and 1B, the liquid crystal device 100 according to the embodiment includes an element substrate 10 and an opposing substrate 20 which is arranged opposite thereto, and a liquid crystal layer 50 which is pinched by the pair of substrates. As the material of the element substrate 10 and the opposing substrate 20, a transparent glass substrate, for example, such as quartz is used.

The element substrate 10 is larger than the opposing substrate 20, both the substrates are bonded to each other via a sealing material 40 which is arranged in a frame shape, and liquid crystal having a positive or negative dielectric anisotropy is filled into the gap thereof, thereby configuring a liquid crystal layer 50. In the sealing material 40, an adhesive, for example, thermosetting resin, UV-curable epoxy resin, or the like is used. A spacer (not shown) for maintaining a uniform gap between the pair of substrates is mixed in the sealing material 40.

On the inside of the sealing material 40 which is arranged in the frame shape, a shielding film 21 which has the same frame shape is provided. The shielding film 21 is formed of, for example, metal with light shielding properties, or metallic oxide, and the inside of the shielding film 21 is a display area E having a plurality of pixels P. In addition, it is not shown in FIGS. 1A and 1B, a light shielding unit for planarly separating the plurality of pixels P is provided in the display area E, as well.

A data line driving circuit 101 is provided between one side portion of the element substrate 10 and the sealing material 40 which is located along one side portion of the element substrate 10. In addition, a checking circuit 103 is provided inside the sealing material 40 which is located along another one side portion facing the one side portion. In addition, a scanning line driving circuit 102 is provided inside the sealing material 40 which goes along other two side portions which are orthogonal to the first side portion, and are facing each other. A plurality of wirings 105 is provided, which connects two scanning line driving circuit 102 to each other, inside the sealing material 40 on other one side portion facing the one side portion. Wirings which are connected to the data line driving circuit 101 and the scanning line driving circuit 102 are connected to a plurality of external connection terminals 104 which is arranged along the first side portion.

Hereinafter, description will be made in which a direction which goes along the one side portion is set as the X direction, and a direction which is orthogonal to the one side portion and goes along other two side portions facing each other is set to the Y direction.

In addition, an arrangement of the checking circuit 103 is not limited thereto, and the checking circuit may be provided at a position which goes along the inside of the sealing material 40 between the data line sealing material 101 and the display area E.

As shown in FIG. 1B, on the surface of the liquid crystal layer 50 side of the element substrate 10, a pixel electrode 15 having light permeability and thin film transistor (TFT) 30 as the switching element which are provided for each pixel, a signal wiring, and an orientation film 18 which covers these are formed.

In addition, a light shielding structure is adopted, which prevents a state in which light is input to the semiconductor layer in TFT 30, and a switching operation becomes unstable. The light shielding structure will be described later.

On a surface of the liquid crystal layer 50 of the opposing substrate 20, a shielding film 21, an interlayer film layer 22 which is formed so as to cover the shielding film 21, a common electrode 23 which is provided so as to cover the interlayer film layer 22, and the orientation film 24 for covering the common electrode 23 are provided.

As shown in FIG. 1A, the shielding film 21 is provided in a frame shape at a position where it is overlapped with a data line driving circuit 101, a scanning line driving circuit 102, or a checking circuit 103 planarly. Due to this, light which is input from the opposing substrate 20 side is shielded, and it plays a role of preventing a malfunction due to the light in the peripheral circuits including these driving circuits. In addition, unnecessary stray light is shielded so as no to be incident on the display area E, and a high contrast is secured in the display of the display area E.

The interlayer film layer 22 is formed of an inorganic material, for example, such as silicon oxide, and is provided so as to cover the shielding film 21, having light transparency. As a formation method of such an interlayer film layer 22, for example, there is a formation method using a plasma CVD technique.

The common electrode 23 is formed of, for example, a transparent conductive film such as ITO, covers the interlayer film layer 22, and as shown in FIG. 1A, is electrically connected to a wiring on the element substrate 10 side by a vertical conduction unit 106 which is provided four corners of the opposing substrate 20.

An orientation film 18 which covers the pixel electrode 15, and an orientation film 24 which covers the common electrode 23 are selected on the basis of an optical design of the liquid crystal device 100. For example, there is an orientation film which is subject to substantially horizontal orientation processing with respect to liquid crystal molecules, by forming a film using an organic material such as polyimide, and rubbing the surface thereof, or an orientation film which is formed by a vapor growth method using an inorganic material such as SiOx (silicon oxide), and is subject to substantially vertical orientation with respect to the liquid crystal molecules.

As shown in FIG. 2, the liquid crystal device 100 includes at least a plurality of scanning lines 3a as signal lines which are insulated from each other in the display area E and a plurality of data lines 6a, and a capacitive wiring 3b which is arranged so as to be parallel along the data line 6a.

A direction in which the scanning line 3a is extended is the X direction, and a direction in which the data line 6a is extended is the Y direction.

The pixel electrode 15, the TFT 30, and two retention capacitors C1 and C2 are provided in a region of the scanning line 3a, the data line 6a, the capacitive wiring 3b, and a region which is separated by these signal lines, and these configure the pixel circuit of the pixel P.

The scanning line 3a is electrically connected to a gate of the TFT 30, and the data line 6a is electrically connected to a source of the TFT 30. The pixel electrode 15 is electrically connected to a drain of the TFT 30.

The data line 6a is connected to the data line driving circuit 101 (refer to FIGS. 1A and 1B), and supplies pixel signals D1, D2, . . . , Dn which are supplied from the data line driving circuit 101 to the pixel P. The scanning line 3a is connected to the scanning line driving circuit 102 (refer to FIGS. 1A and 1B), and supplies main scanning signals SC1, SC2, . . . , SCm which are supplied from the scanning line driving circuit 102 to each pixel P. The pixel signals D1 to Dn which are supplied to the data line 6a from the data line driving circuit 101 may be sequentially supplied in this order, and may be supplied in a group with respect to the fellows of the plurality of data lines 6a which are adjacent to each other. The scanning line driving circuit 102 supplies the main scanning signals SC1 to SCm with respect to the scanning line 3a in a pulse, and linearly sequentially at a predetermined timing.

The liquid crystal device 100 has a configuration in which the image signals D1 to Dn which are supplied from the data line 6a are written in the pixel electrode 15 at a predetermined timing, when the TFT 30 as the switching element is subject to an on state for a predetermined period due to an input of the main scanning signals SC1 to SCm. In addition, the image signals D1 to Dn of a predetermined level which are written in the liquid crystal layer 50 through the pixel electrode 15 is held for a certain period between the pixel electrode 15 and the common electrode 23 which is arranged opposite thereto interposing the liquid crystal layer 50.

Since the held image signals D1 to Dn are prevented from being leaked, the retention capacitors C1 and C2 are connected in parallel to the liquid crystal capacitance which is formed between the pixel electrode 15 and the common electrode 23. The retention capacitors C1 and C2 are provided between the drain of the TFT 30 and the capacitive wiring 3b. The retention capacitors C1 and C2 are configured such that a part of the pixel electrode 15 is overlapped with the two capacitive wirings 3b which are adjacent and parallel to each other through the dielectric layer, though it will be described in detail later. A retention capacitor C1 is configured between one of the capacitive wirings 3b and the pixel electrode 15, and a retention capacitor C2 is configured between the other capacitive wirings 3b and the pixel electrode 15. The capacitive wiring 3b is connected to a fixed potential.

In addition, the checking circuit 103 which is shown in FIG. 1A is connected with the data line 6a, and it is configured such that a defect behavior or the like of the liquid crystal device 100 is checked in a manufacturing process of the liquid crystal device 100, however, it is omitted in the equivalent circuit in FIG. 2. In addition, the checking circuit 103 may include a sampling circuit which performs sampling of the image signal and supplies the image signal to the data line 6a, and a precharge circuit which previously supplies a precharge signal of a predetermined voltage level to the data line 6a.

Such a liquid crystal device 100 is a transmission type, and adopts an optical design of a normally white mode in which the pixel P becomes a bright display when the pixel P is not driven, or a normally black mode in which the pixel P becomes a black display when the pixel P is driven. A polarizing element is arranged and used according to the optical design in each of the light input side and the light output side.

Figure 3:
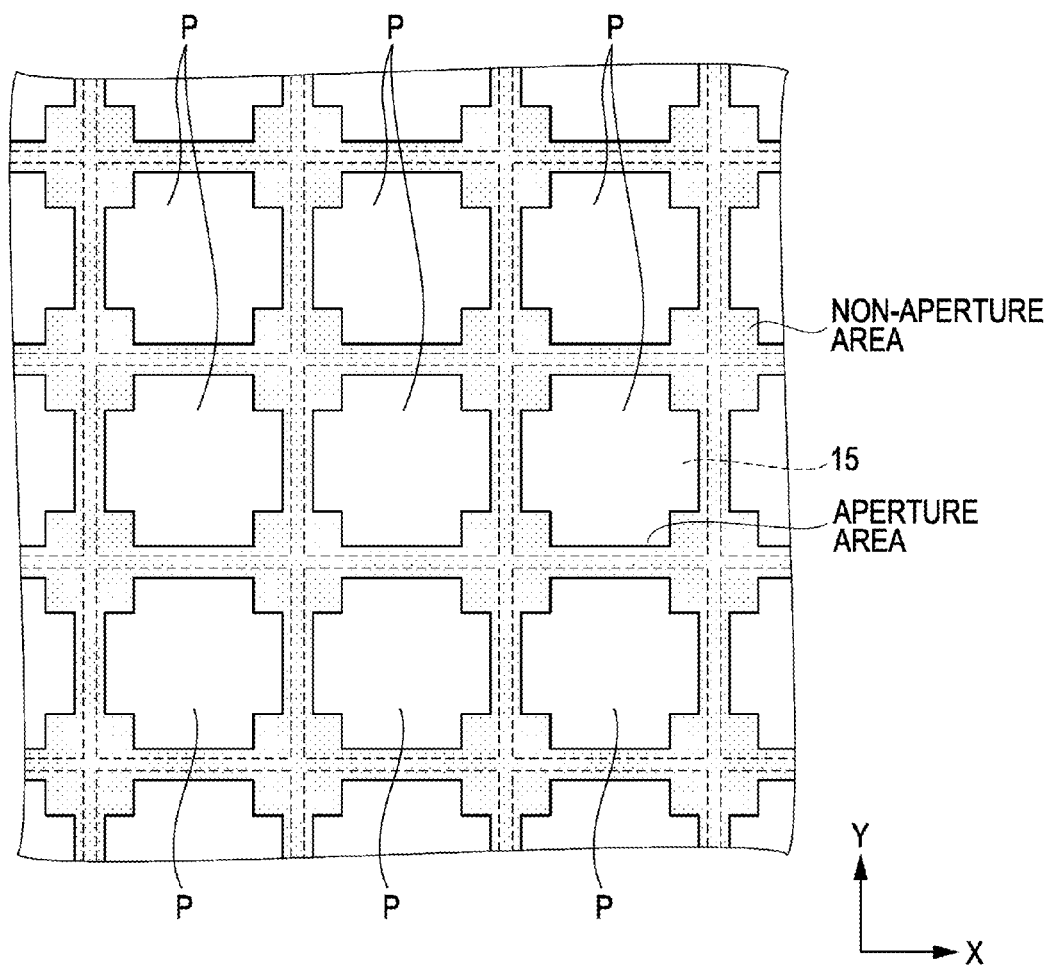
FIG. 3 is a schematic plan view which shows a pixel array in the liquid crystal device.
Figure 4A:
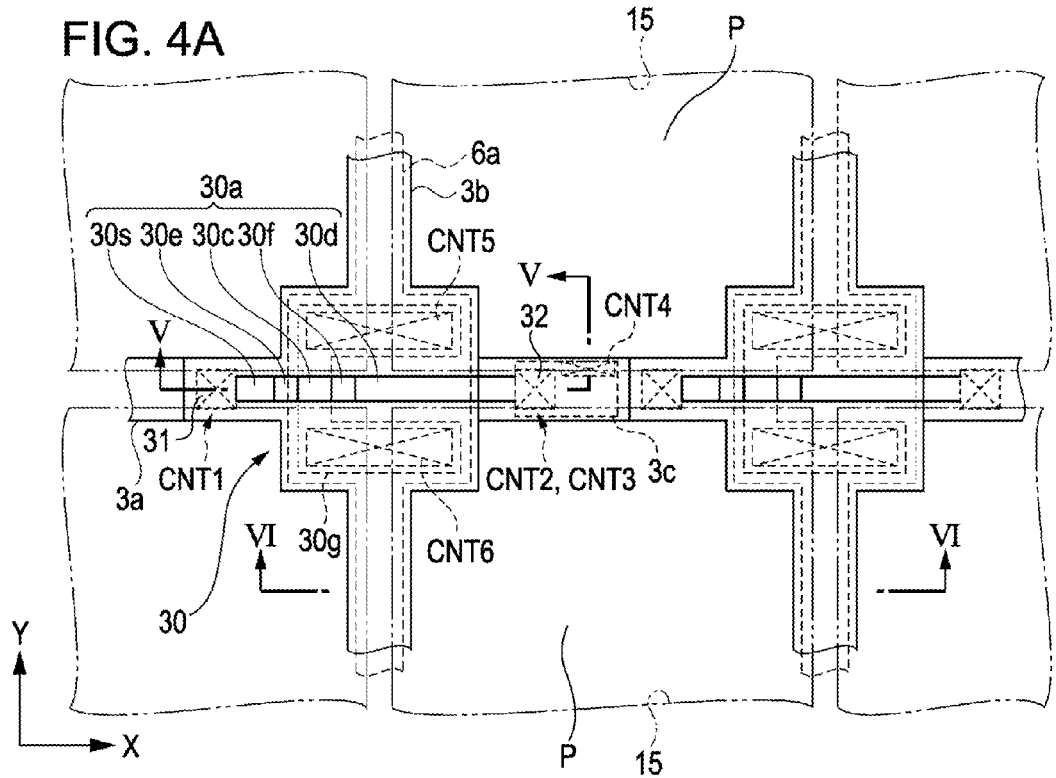
FIGS. 4A and 4B are schematic plan views which show a configuration of pixels in the liquid crystal device.
Figure 4B:
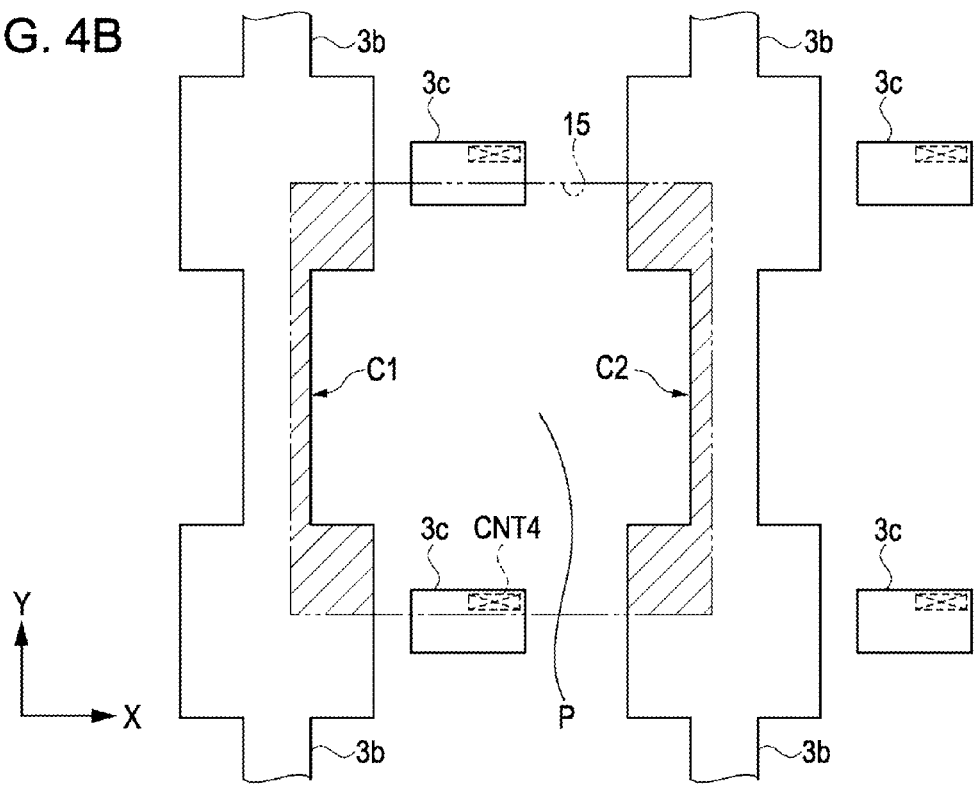
Figure 5:
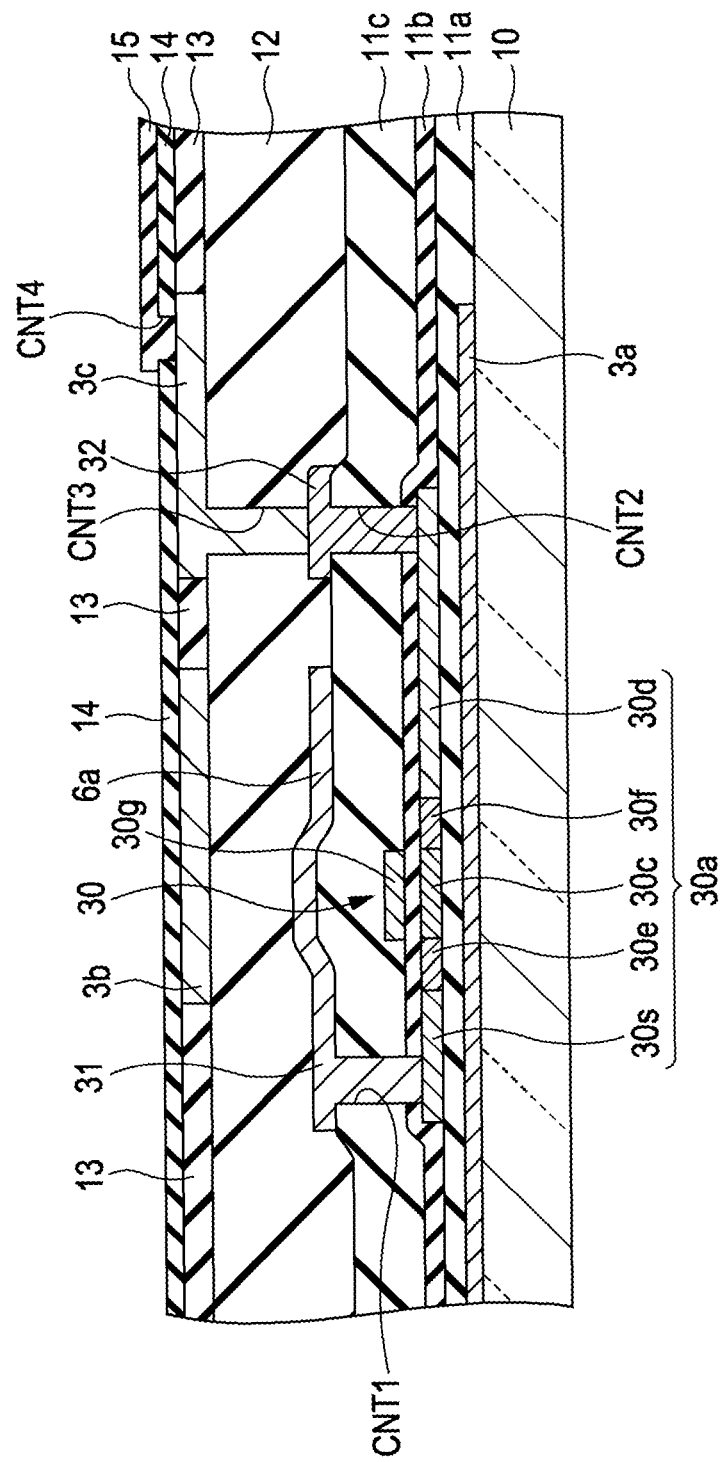
FIG. 5 is a schematically cross-sectional view which shows a structure of pixels taken along line V-V in FIG. 4.
Figure 6:
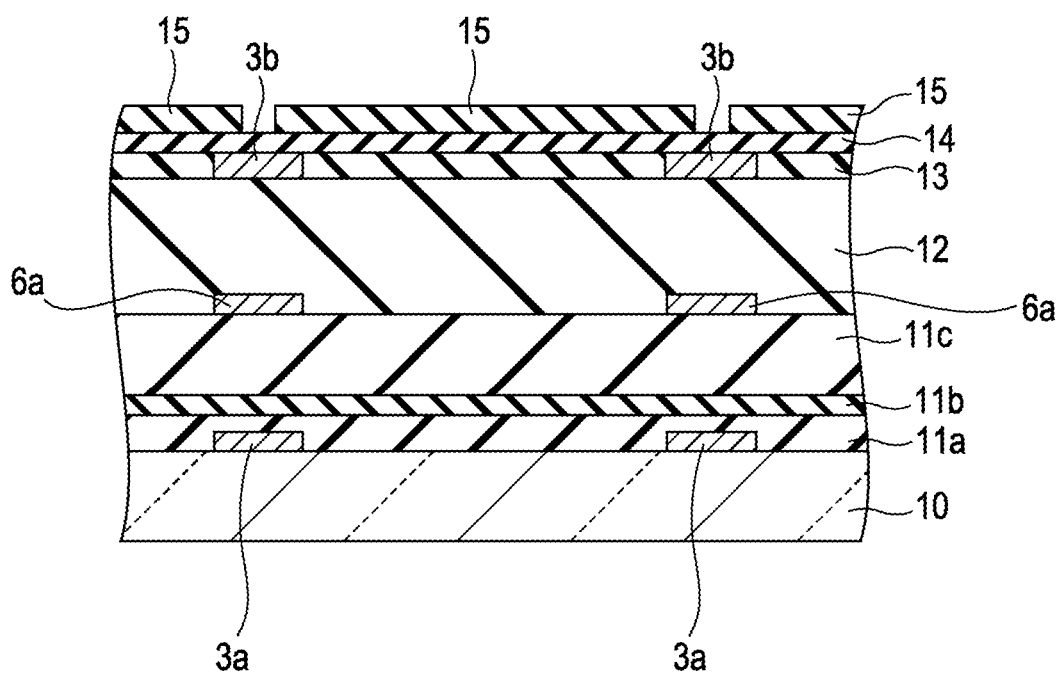
FIG. 6 is a schematically cross-sectional view which shows a structure of pixels taken along line VI-VI in FIG. 4.

Subsequently, a planar arrangement and a structure of the pixel P will be described with reference to FIGS. 3 to 6. FIG. 3 is schematic plan view which shows the arrangement of the pixel in the liquid crystal device according to the first embodiment, and FIGS. 4A and 4B are schematic plan views which show a configuration of pixels in the liquid crystal device according to the first embodiment, FIG. 5 is a schematic cross-sectional view which shows a structure of pixels taken along line V-V in FIG. 4A, and FIG. 6 is a schematic cross-sectional view which shows the structure of pixels taken along line VI-VI in FIG. 4B.

As shown in FIG. 3, the pixel P in the liquid crystal device 100 has an aperture area of, for example, substantially rectangular in a plane. The aperture area is surrounded by a light shielding non-aperture area which extends in the X direction and Y direction, and is provided in a lattice shape.

The scanning line 3a shown in FIG. 2 is provided in the non-aperture area which extends in the X direction. A conductive member with a light shielding property is used in the scanning line 3a, and at least a part of the non-aperture area is configured by the scanning line 3a.

Similarly, the data line 6a and the capacitive wiring 3b shown in FIG. 2 are provided in the non-aperture area which extends in the Y direction. The conductive member with the light shielding property is used in the data line 6a and the capacitive wiring 3b, as well, and at least a part of the non-aperture area is configured by the data line 6a and the capacitive wiring 3b.

It is possible to configure the non-aperture area not only by the signal lines which are provided on the element substrate 10 side, but by the shielding film 21 which is patterned on the opposing substrate 20 side.

The TFT 30 shown in FIG. 2 is provided in the vicinity of a crossing of the non-aperture area. By providing the TFT 30 in the vicinity of the crossing of the non-aperture area with the light shielding property, it is possible to prevent a light malfunction of the TFT 30, and to secure the aperture ratio in the aperture area. The detailed structure of the pixel P will be described later, however, the width of the non-aperture area in the vicinity of the crossing becomes large compared to other portions, since the TFT 30 is provided in the vicinity of the crossing.

The pixel electrode 15 is arranged so that an outer edge portion thereof is overlapped with respect to the non-aperture area which is provided in the lattice shape.

As shown in FIG. 4A, the TFT 30 of the pixel P is provided at a crossing of the scanning line 3a and the data line 6a. The TFT 30 includes a semiconductor layer 30a of an LDD (Lightly Doped Drain) structure having the source region 30s, the drain region 30d, the channel region 30c, a junction region 30e which is provided between the source region 30s and the channel region 30c, and a junction region 30f which is provided between the channel region 30c and the drain region 30d. The semiconductor layer 30a is arranged so as to pass through the crossing and to be overlapped with the scanning line 3a.

The scanning line 3a has a rectangular extension portion which is extended in the X and Y directions at the crossing with the data line 6a, when planarly viewed. There is provided a gate electrode 30g of a bent shape having an opening which is overlapped with the extension portion in the plane, and is not overlapped with the junction region 30f and the drain region 30d.

A portion of the gate electrode 30g which is extended in the Y direction is overlapped with the channel region 30c in the plane. In addition, the gate electrode 30g is extended in the X direction by being bent from a portion which is overlapped with the channel region 30c, and of which portions facing each other are electrically connected to the scanning line 3a, respectively, by contact holes CNT 5 and CNT 6 which are provided by interposing the extension portion of the scanning line 3a therebetween.

The contact holes CNT 5 and CNT 6 are long rectangular shapes (rectangle) in the X direction when planarly viewed, and are provided at both sides so as to pinch the junction region 30f along the channel region 30c and the junction region 30f of the semiconductor layer 30a.

The data line 6a is extended in the Y direction, similarly, has the rectangular extension portion at the crossing with the scanning line 3a, when planarly viewed, and is electrically connected to the source region 30s by a contact hole CNT 1 which is provided at a portion protruding in the X direction from the extension portion. The portion including the contact hole CNT 1 becomes a source electrode 31 (refer to FIG. 5). On the other hand, two contact holes CNT 2 and CNT 3 which are overlapped with each other and bonded are provided at the end portion of the drain region 30d, and the portion including the contact hole CNT 2 becomes a drain electrode 32 (refer to FIG. 5).

A contact hole CNT 4 is provided in the vicinity of the contact holes CNT 2 (CNT 3). The contact holes CNT 3 and CNT 4 are electrically connected to each other by a relay layer 3c which is provided so as to be overlapped therewith.

The outer edge portion of the pixel electrode 15 is provided so as to be overlapped with respect to the scanning line 3a or the data line 6a, and is connected to the contact hole CNT 4 which is provided at a position overlapped with the scanning line 3a, in the embodiment. That is, the pixel electrode 15 is electrically connected to the drain electrode 32 through the contact hole CNT 4, the relay layer 3c, and the contact holes CNT 2 and CNT 3.

As shown in FIG. 4B, the capacitive wiring 3b is overlapped with the data line 6a in the plane and is extended in the Y direction, and similarly, has the rectangular extension portion at a position corresponding to the crossing of the scanning line 3a and data line 6a. The pixel electrode 15 is provided so as to cross two capacitive wirings 3b which are parallel to each other, in which a portion which is planarly overlapped with one capacitive wiring 3b (shaded portion) functions as a retention capacitor C1, and a portion which is planarly overlapped with the other capacitive wiring 3b (shaded portion) functions as a retention capacitor C2.

The relay layer 3c which is rectangular when planarly viewed, and is formed on the same wiring layer as that of the capacitive wiring 3*b* is provided between the two capacitive wirings 3*b*. As described above, the contact hole CNT 4 is provided so as to be overlapped with the relay layer 3*c*, and is connected to the pixel electrode 15.

In addition, similarly, the pixel electrode 15 is provided in other pixels P, as well, and the retention capacitors C1 and C2 are configured, though it is not shown in FIG. 4B.

Subsequently, the structure of the pixel P will be more specifically described with reference to FIGS. 5 and 6.

As shown in FIG. 5, first, the scanning line 3*a* is formed on the element substrate 10. The scanning line 3*a* is formed of, for example, simple metal which includes at least one of metal of Al, Ti, Cr, W, Ta, Mo, or the like, an alloy, metal silicide, polyimide, nitride, or a lamination of these, and has a light shielding property.

The semiconductor layer 30*a* of an islet is formed on the base insulating film 11*a*, by forming the base insulating film 11*a* which is formed of, for example, silicon oxide so as to cover the scanning line 3*a*. The semiconductor layer 30*a* is formed of, for example, polycrystalline silicon film, is filled with impurity ion, and forms an LDD structure including the above described source region 30*s*, junction region 30*e*, channel region 30*c*, junction region 30*f*, and the drain region 30*d*.

A first insulating film (gate insulating film) 11*b* is formed so as to cover the semiconductor layer 30*a*. Further, the gate electrode 30*g* is formed at a position facing the channel region 30*c*, by pinching the first insulating film 11*b*.

A second insulating film 11*c* is formed so as to cover the gate electrode 30*g* and the first insulating film 11*b*, and the two contact holes CNT 1 and CNT 2 which pass through the first insulating film 11*b* and the second insulating film 11*c* are formed at a position of being overlapped with respective end portions of the semiconductor layer 30*a*. In addition, the source electrode 31 and the data line 6*a* which is connected to the source region 30*s* through the contact hole CNT 1 is formed, by embedding the two contact holes CNT 1 and CNT 2, forming a conductive film using a conductive material with light shielding property such as Al (aluminum) so as to cover the second insulating film 11*c*, and by patterning this. At the same time, a drain electrode 32 which is connected to a drain range 30*d* through the contact hole CNT 2 is formed. That is, the source electrode 31, the data line 6*a*, and the drain electrode 32 are patterned in the same conductive layer.

An interlayer insulating film 12 is formed so as to cover the data line 6*a*, the drain electrode 32, and the second insulating film 11*c*. The interlayer insulating film 12 is formed of, for example, silicon oxide, or silicon nitride, and is subject to planarizing processing for planarizing unevenness on a surface which occurs when covering a region where the TFT 30 is provided. As a method of the planarizing processing, for example, there is Chemical Mechanical Polishing (CMP) processing, spin-coating processing, or the like.

A conductive film with the light shielding property is configured by forming the contact hole CNT 3 which passes through the interlayer insulating film 12 at a position of being overlapped with the drain electrode 32, and by embedding the contact hole CNT 3. The relay layer 3*c* which is connected to the drain electrode 32 through the capacitive wiring 3*b* and the contact hole CNT 3 is formed by patterning the conductive film. It will be more specifically described later, however, the capacitive wiring 3*b* and the relay layer 3*c* are formed so as to be embedded in the insulating film 13, and a surface thereof is planarized so as to be on the same plane as that of the insulating film 13 which covers the interlayer insulating film 12.

In addition, in the above described conductive film with the light shielding property which configures the capacitive wiring 3*b*, or the relay layer 3*c*, a lamination of the first conductive film which is formed of Al (aluminum), and the second conductive film, which is formed of TiN (titanium nitride), or the like, which protects the first conductive film is used.

Subsequently, a dielectric film is formed so as to cover the capacitive wiring 3*b*, or the relay layer 3*c*, and the insulating film 13, and patterning is performed so as to remove a portion of the dielectric film which is overlapped with the contact hole CNT 4 connected to the pixel electrode 15, thereby forming a dielectric layer 14. As the dielectric film, for example, a single layer film such as a silicon nitride film, oxide hafnium ($HfO_2$), alumina ($Al_2O_3$), tantalum oxide ($Ta_2O_5$), or a multilayer film in which at least two of these single layer films are laminated may be used.

Subsequently, a transparent conductive film such as ITO, or IZO is formed so as to cover a dielectric layer 14, and the pixel electrode 15 which is connected to the relay layer 3*c* is formed by patterning the transparent conductive film through the contact hole CNT 4.

As shown in FIG. 6, the pixel electrode 15 is patterned so that the outer edge portion thereof is overlapped with the two capacitive wirings 3*b* which are adjacent and parallel to each other on the dielectric layer 14. The portion of the pixel electrode 15 which is overlapped with the two capacitive wirings 3*b* through the dielectric layer 14 becomes the retention capacitors C1 and C2. Since the surfaces of the capacitive wiring 3*b* and the insulating film 13 are on the same plane, the dielectric layer 14 which covers these is formed in the flat state, and the surface of the pixel electrode 15 which is formed on the dielectric layer 14 is also flat.

In such a wiring structure of the element substrate 10, a fixed potential is applied to the capacitive wiring 3*b*. As the fixed potential, an intermediate potential between a driving voltage Vdd and a reference voltage Vss in the liquid crystal device 100 is applied to the capacitive wiring 3*b*. For example, when the maximum potential of the driving voltage Vdd is 15.5 V and the reference voltage Vss is 0 V, a potential of about 6.5 V+/−1 V is applied as the intermediate potential.

In addition, as a method of connecting the capacitive wiring 3*b* to the fixed potential, for example, there is a method in which the capacitive wiring 3*b* is pulled out to a peripheral region of the outside of the display area E shown in FIG. 1A, and is connected to a wiring which is supplied to the fixed potential.

Manufacturing Method of Liquid Crystal Device

Subsequently, a manufacturing method of a liquid crystal device according to the embodiment will be described with reference to FIGS. 7A to 7F. FIGS. 7A to 7F are schematic cross-sectional views which show the manufacturing method of the liquid crystal device. Specifically, the figure shows a formation method of the retention capacitor on the element substrate 10, and corresponds to the cross-sectional view in FIG. 6.

The structure of the pixel P on the element substrate 10 is the same as that described above, and hereinafter, the formation method of the capacitive wiring 3*b*, the dielectric layer 14, and the pixel electrode 15 which configure the retention capacitors C1 and C2 on the interlayer insulating film 12 will be described in detail.

Figure 7A:
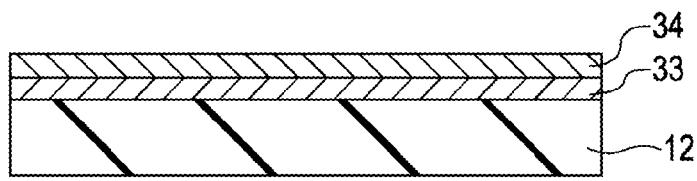
FIGS. 7A to 7F are schematically cross-sectional views which show a manufacturing method of the liquid crystal device.

First, as shown in FIG. 7A, the first conductive film 33 and the second conductive film 34 which protects the first conductive film 33 are formed by covering the interlayer insulating film 12.

The first conductive film 33 is, for example, formed of Al (aluminum), and the thickness thereof is about 500 nm. In the second conductive film 34, it is possible to adopt a compound of metal, nitride, and oxygen such as TiN (titanium nitride) in which oxidization and corrosion hardly occurs compared to Al, and which has conductivity. The thickness of the second conductive film 34 is set to about 500 nm which is approximately the same as that of the first conductive film 33, in consideration of formation processing and polishing processing of the insulating film 13 in later.

Figure 7B:
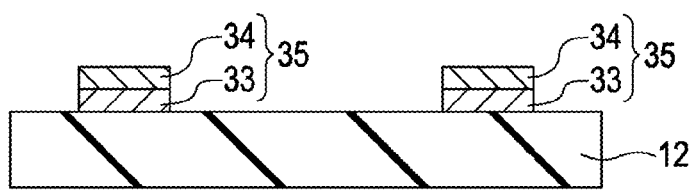

Subsequently, as shown in FIG. 7B, capacitive wiring layers 35 which are parallel to each other with a predetermined gap are formed (formation processing of the capacitive wiring layer), by patterning the first conductive film 33 and the second conductive film 34 which are laminated, using, for example, a photolithographic method.

Figure 7C:
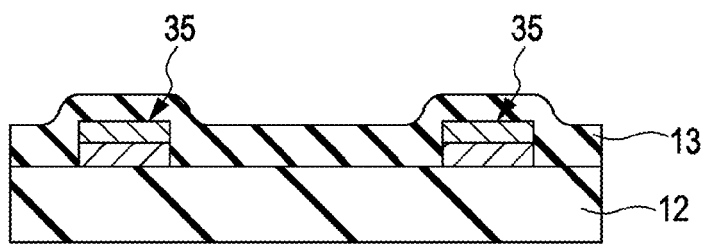

Subsequently, as shown in FIG. 7C, the insulating film 13 which covers the capacitive wiring layer 35 is formed.

In the insulating film 13, it is possible to use silicon oxide or silicon nitride, and the insulating film is formed so that the thickness thereof becomes 1000 nm to 1500 nm using, for example, a plasma CVD technique. In this manner, it is possible to sufficiently cover the capacitive wiring layer 35. On the surface of the insulating film 13 which covers the capacitive wiring layer 35, unevenness occurs. According to the embodiment, the insulating film 13 is formed using $SiO_2$.

Figure 7D:
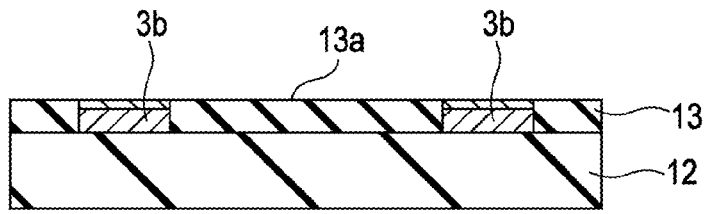

Subsequently, as shown in FIG. 7D, the unevenness is removed, the capacitive wiring layer 35 is exposed, the insulating film 13 is polished and planarized (polishing processing of the insulating film) until the surface of the exposed capacitive wiring layer 35 and the surface 13a of the insulating film 13 are on the same plane. The polishing is performed until the thickness of the second conductive film 34 becomes about 500 nm to 100 nm in the capacitive wiring layer 35, not only for the insulating film 13, in order to make sure the plane flush. Accordingly, the thickness of the insulating film 13 and the capacitive wiring layer 35 after the polishing, that is, the thickness of the capacitive wiring 3b is about 600 nm. In the polishing of the insulating film 13, it is possible to adopt, for example, chemical mechanical polishing (CMP) processing using a chemical treatment, or a mechanical processing process using abrasive.

Figure 7E:
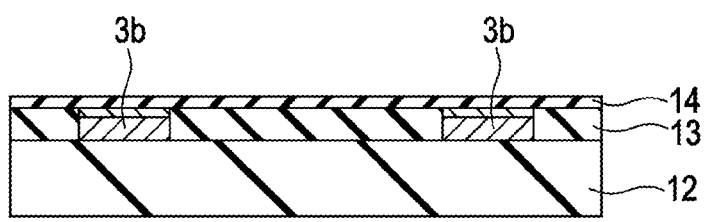

Subsequently, as shown in FIG. 7E, the dielectric film is formed by covering the capacitive wiring 3b and the insulating film 13 which are on the same plane. As described above, only a portion of the dielectric film corresponding to the contact hole CNT 4 is removed by etching, and the dielectric layer 14 is formed (formation processing of the dielectric layer).

As the dielectric film, as described above, it is possible to use a single layer film such as silicon nitride film, oxide hafnium ($HfO_2$), alumina ($Al_2O_3$), tantalum oxide ($Ta_2O_5$), or a multilayer film in which at least two of these single layer films are laminated may be used. According to the embodiment, the thickness is set to 20 nm to 30 nm, by laminating the alumina ($Al_2O_3$) and oxide hafnium ($HfO_2$) in this order, so that the refractivity n becomes about 1.7.

Figure 7F:
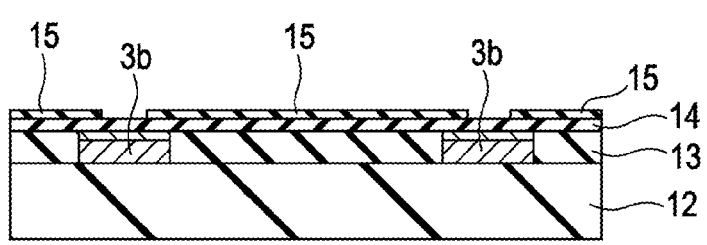

Subsequently, as shown in FIG. 7F, the transparent conductive film such as ITO or IZO is formed on the dielectric layer 14, for example, so that the thickness thereof becomes 20 nm to 200 nm, and is patterned using the photolithographic method, thereby forming the pixel electrode 15 of which a portion is overlapped with the two parallel capacitive wirings 3b. According to the embodiment, the pixel electrode 15 is formed using ITO of which the refractivity n is about 1.9. Due to this, since the refractivity n of the insulating film 13 formed of $SiO_2$ is about 1.46, it is possible to arrange the dielectric layer 14 between the insulating film 13 and the pixel electrode 15, of which the refractivity n denotes the intermediate value of the insulating film and the pixel electrode. Accordingly, it is possible to secure a desired transmittance in the aperture area, since the refractivity of light on the film interface which is input to a film of which the refractivity n is different is reduced, and the input light is hardly attenuated.

According to the liquid crystal device 100 and the manufacturing method thereof in the embodiment, following effect can be obtained.

(1) The capacitive wiring 3b is formed so as to be embedded in the insulating film 13, and the surface 13a of the insulating film 13 and the surface of the capacitive wiring 3b are planarized so as to be on the same plane. Accordingly, the surface of the pixel electrode 15 which is arranged through the dielectric layer 14 with respect to the insulating film 13, or the capacitive wiring 3b is planarized without being uneven. Therefore, it is possible to provide the liquid crystal device 100 in which the display unevenness due to the disorder of orientation of the liquid crystal molecules caused by the unevenness is reduced.

In addition, the pixel electrode 15 configures the two retention capacitors C1 and C2 such that the outer edge portion thereof is arranged so as to be overlapped with the two capacitive wirings 3b which are adjacent and parallel to each other. The retention capacitors C1 and C2 are provided in the non-aperture area, as shown in FIGS. 3 and 4B, the aperture area is not made narrow by being provided with the provision of the retention capacitors C1 and C2. In other words, it is possible to realize the retention capacitors C1 and C2 with a desired electric capacity, and to secure a high aperture ratio.

That is, it is possible to realize or manufacture the liquid crystal device 100 in which the display unevenness is reduced, and which has an excellent display quality (bright).

(2) The capacitive wiring layer 35 is formed of the first conductive film 33 and the second conductive film 34 which protects the first conductive film. In addition, in the process of polishing the insulating film 13 which covers the capacitive wiring layer 35, even when the capacitive wiring layer 35 and the surface 13a of the insulating film 13 are polished so as to be reliably on the same plane, the first conductive film 33 which configures the capacitive wiring 3b is not damaged. Accordingly, it is possible to obtain the retention capacitors C1 and C2 with no electrical defects, since the electrical property in the first conductive film 33 is maintained.

Second Embodiment

Electronic Device

FIG. 8 is a schematic diagram which shows a configuration of a projection-type display device as an electronic device. As shown in FIG. 8, a projection-type display device 1000 as the electronic device according to the embodiment includes a polarized illumination device 1100 which is arranged along a system optical axis L, two dichroic mirrors 1104 and 1105 as a light separating element, three reflecting mirrors 1106, 1107, and 1108, five relay lenses 1201, 1202, 1203, 1204, and 1205, three transmission type liquid crystal light valves 1210, 1220, and 1230 as light modulation units, a cross dichroic prism 1206 as a photosynthesis element, and a projector lens 1207.

The polarized illumination device 1100 is schematically configured by a lamp unit 1101 as a light source which is formed of a white light source such as an ultra high pressure mercury lamp, or a halogen lamp, an integrator lens 1102, and a polarization conversion element 1103.

The dichroic mirror 1104 transmits the green light (G) and blue light (B) by reflecting the red light (R) among polarized light beams which are emitted from the polarized illumination device 1100. The other dichroic mirror 1105 transmits the blue light (B) by reflecting the green light (G) which has transmitted the dichroic mirror 1104.

The red light (R) which is reflected in the dichroic mirror 1104 is input to the liquid crystal light valve 1210 passing through the relay lens 1205 after being reflected in the reflecting mirror 1106.

The green light (G) which is reflected in the dichroic mirror 1105 is input to the liquid crystal light valve 1220 passing through the relay lens 1204.

The blue light (B) which has transmitted the dichroic mirror 1105 inputs to the liquid crystal light valve 1230 passing through a light guiding system which is formed of three relay lenses 1201, 1202, and 1203, and two reflecting mirrors 1107, and 1108.

The liquid crystal light valves 1210, 1220, and 1230 are arranged opposite with respect to the input surface of each color light of the cross dichroic prism 1206, respectively. The color light which is input to the liquid crystal light valves 1210, 1220, and 1230 is modulated on the basis of image information (image signal), and is emitted to the cross dichroic prism 1206. The prism is formed such that four right angle prisms are attached, and in which a dielectric multilayer film which reflects the red light, and a dielectric multilayer film which reflects the blue light are formed in a cross shape. Three color light beams are synthesized by these dielectric multilayer films, and light which expresses a color image is synthesized. The synthesized light is projected on a screen 1300 by the projector lens 1207 as a projection optical system, and the image is displayed by being enlarged.

The above described liquid crystal device 100 is applied to the liquid crystal light valve 1210. The liquid crystal device 100 is arranged with a gap between a pair of polarizing elements which are arranged in the cross Nichol prism in the input side and output side of the color light. The same is applied to other liquid crystal light valves 1220 and 1230.

According to the projection-type display device 1000, it is possible to realize a high display quality, since the display unevenness is reduced, and the liquid crystal device 100 with a high aperture ratio is used as the liquid crystal light valves 1210, 1220, and 1230.

A variety of modification examples can be considered in addition to the above described embodiments. Hereinafter, the modification examples will be exemplified.

MODIFICATION EXAMPLE 1

In the above described embodiment, the formation method of the retention capacitor in which the surface of the capacitive wiring layer 35 and the surface 13a of the insulating film 13 are planarized so as to be on the same plane, however, the method is not limited thereto. FIGS. 9A to 9D are schematic cross-sectional views which show a manufacturing method (formation method of a retention capacitor) of a liquid crystal device in the modification example.

Figure 9A:
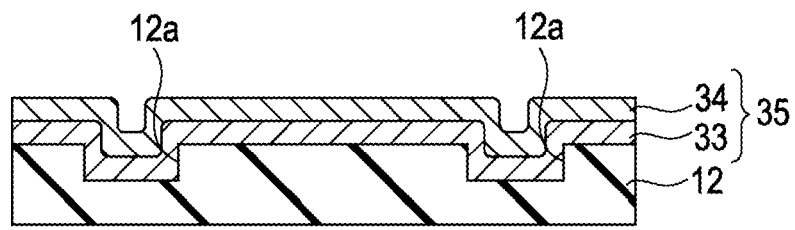
FIGS. 9A to 9D are schematically cross-sectional views which show a manufacturing method (a formation method of a retention capacitor) of a liquid crystal device of a modification example.

For example, first, as shown in FIG. 9A, a groove 12a is formed in a region where a capacitive wiring 3b of an interlayer insulating film 12 as an insulating film is formed (formation processing of groove).

When forming the groove 12a, it is possible to form a contact hole CNT 3 and the groove 12a in the same process, for example, when it is controlled so that the etching depth of the interlayer insulating film 12 is shallower than that of the contact hole CNT 3 using a half-tone mask, when forming the contact hole CNT 3 shown in FIG. 5 in the interlayer insulating film 12.

Subsequently, a capacitive wiring layer 35 is formed (formation processing of capacitive wiring layer) by laminating a first conductive film 33 and a second conductive film 34, by covering the interlayer insulating film 12 so as to embed the groove 12a.

Figure 9B:
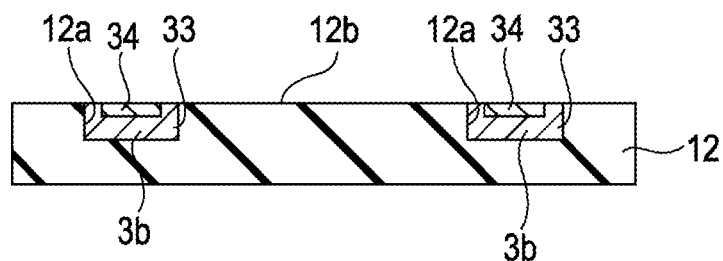

Subsequently, as shown in FIG. 9B, a capacitive wiring layer 35 is polished, and the surface 12b of the exposed interlayer insulating film 12 and the surface of the capacitive wiring layer 35 (that is, capacitive wiring 3b) are planarized so as to be on the same plane. For the polishing of the capacitive wiring layer 35, for example, it is possible to adopt chemical mechanical polishing (CMP) processing using a chemical treatment, or a mechanical processing process using an abrasive as in the case of the insulating film 13. In practice, the interlayer insulating film 12 is also polished a little for the planarization.

Figure 9C:
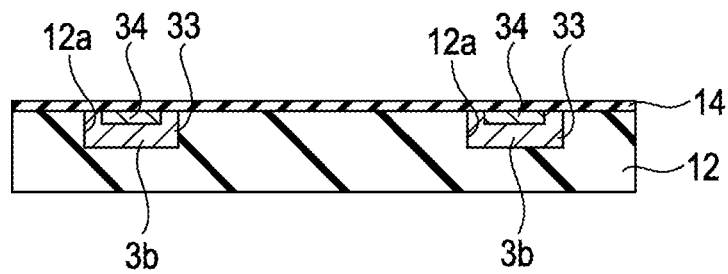

Subsequently, as shown in FIG. 9C, a dielectric layer 14 is formed (formation processing of dielectric layer) by covering the capacitive wiring 3b and the interlayer insulating film 12.

Figure 9D:
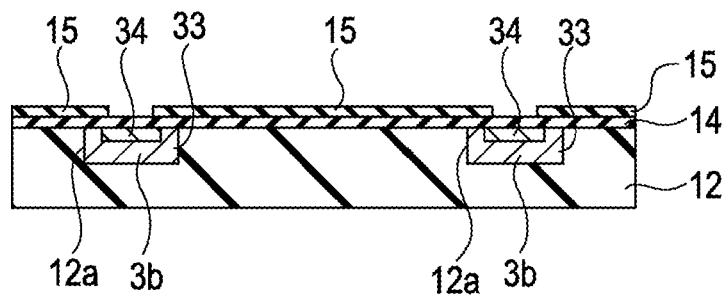

In addition, as shown in FIG. 9D, a transparent conductive film such as ITO, or IZO is formed on the dielectric layer 14, these are patterned using a photolithographic method, thereby forming the pixel electrode 15 of which a portion is overlapped with two capacitive wirings 3b which are parallel to each other.

According to a manufacturing method of the liquid crystal device in the modification example (formation method of retention capacitor), processing of forming the insulating film 13 on the interlayer insulating film 12 is not necessary. In addition, in the processing of polishing the capacitive wiring layer 35, when the polishing speed of the capacitive wiring layer 35 is faster than that of the interlayer insulating film 12, it is possible to expose the capacitive wiring 3b from the capacitive wiring layer 35 earlier. In addition, since the groove 12a is embedded by the capacitive wiring layer 35, it is possible to prevent the capacitive wiring layer 35 from being excessively polished in order to make the surface thereof be in the same plane with respect to the surface 12b of the interlayer insulating film 12. In other words, it is possible to avoid waste in film formation, since it is possible to form the capacitive wiring layer 35 with a thickness which is close to the thickness necessary to form the capacitive wiring 3b. It exerts the same effect when compared to a case where the insulating film 13 in the above described embodiment is polished.

MODIFICATION EXAMPLE 2

The configuration of a capacitive wiring 3b in a liquid crystal device is not limited thereto. For example, it is also possible to arrange the capacitive wiring 3b in the extension direction (X direction) of a scanning line 3a, by removing a portion where a contact hole CNT 4 of a pixel electrode 15 is provided. In addition, the capacitive wiring 3b may be provided in a lattice shape as the non-aperture area shown in FIG. 3. In this manner, it is possible to further increase a portion which functions as a retention capacitor.

MODIFICATION EXAMPLE 3

The arrangement of a semiconductor layer 30a in the liquid crystal device 100 is not limited thereto. For example, it is possible to apply the arrangement of a structure of the retention capacitor according to the invention, even when the semiconductor layer 30a is arranged in a direction which goes along a data line 6a, at the intersection of a scanning line 3a and a data line 6a, or the semiconductor layer 30a is arranged by being bent at the intersection.

MODIFICATION EXAMPLE 4

The electronic device to which the liquid crystal device 100 is applied is not limited to the projection-type display device 1000 in the above described embodiment. The liquid crystal device is preferably used as a display unit of, for example, such as a projection-type HUD (Heads Up Display), a direct viewing type HMD (Head-Mounted Display) or an electronic book, a personal computer, a digital still camera, a liquid crystal TV, a video recorder of a viewfinder type, or of a direct-view monitor type, a car navigation system, an electronic organizer, POS, or the like, information terminal devices.

MODIFICATION EXAMPLE 5

The electronic device to which a structure of the retention capacitors C1 and C2 of the element substrate 10 is applicable is not limited to the liquid crystal device 100. For example, as an active matrix electro-optic device having a transistor, it is possible to apply to a display device such as an organic EL (Electro Luminescence) device, or an electrophoresis apparatus.

When the device is applied to the organic EL device, it is possible to make the film thickness of the functional layer having a function of light emission which is formed on the pixel electrode be uniform, easily. In addition, it is possible to reduce uneven light emission.

When the device is applied to the electrophoresis apparatus, it is possible to make the film thickness of an electrophoresis layer on the pixel electrode be uniform. In addition, it is possible to reduce display unevenness.

This application claims priority to Japan Patent Application No. 2011-081650 filed Apr. 1, 2011, the entire disclosures of which are hereby incorporated by reference in their entireties.

What is claimed is:

1. An electro-optic device comprising:
a substrate;
a transistor;
a pixel electrode; and
a first capacitive wiring that is an electrode of a retention capacitor;
the retention capacitor including the first capacitive wiring, a dielectric layer, and the pixel electrode,
the first capacitive wiring being embedded in a concave portion of an insulating film that is disposed between the substrate and the pixel electrode,
the first capacitive wiring extending along a direction crossing a direction from source to drain of the transistor,
the first capacitive wiring being disposed apart from a second capacitive wiring that is disposed next to the first capacitive wiring.

2. The electro-optic device according to claim 1,
the capacitive wiring including a first conductive film, and a second conductive film that covers the first conductive film, and
a surface of the second conductive film and a surface of the insulating film being on the same plane.

3. The electro-optic device according to claim 1,
the pixel electrode crossing the first capacitive wiring and the second capacitive wiring.

4. An electronic device comprising:
the electro-optic device according to claim 1.

5. An electro optical device comprising:
a substrate;
a plurality of transistors;
a plurality of pixel electrodes, one of the plurality of pixel electrodes electrically connecting to one of the plurality of transistors; and
a plurality of capacitive wirings, each of the plurality of capacitive wirings extending along a direction crossing a direction from source to drain of the one of the plurality of transistors,
the one of the plurality of transistors electrically connecting to a retention capacitor, the retention capacitor including one of the plurality of capacitive wirings, a dielectric layer, and the one of the plurality of pixel electrodes,
the one of the plurality of capacitive wirings being disposed at a recess of an insulating film that is disposed between the substrate and the one of the plurality of pixel electrodes.

* * * * *